(12) United States Patent
Delshadpour et al.

(10) Patent No.: US 11,228,470 B2
(45) Date of Patent: Jan. 18, 2022

(54) CONTINUOUS TIME LINEAR EQUALIZATION CIRCUIT

(71) Applicant: NXP B.V., Eindhoven (NL)

(72) Inventors: Siamak Delshadpour, Phoenix, AZ (US); Xu Zhang, Chandler, AZ (US); Tong Liu, College Station, TX (US); Samuel Michael Palermo, College Station, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/876,970

(22) Filed: May 18, 2020

(65) Prior Publication Data

US 2021/0359884 A1    Nov. 18, 2021

(51) Int. Cl.
*H04L 25/03*    (2006.01)

(52) U.S. Cl.
CPC .. *H04L 25/03885* (2013.01); *H04L 25/03019* (2013.01)

(58) Field of Classification Search
CPC ................... H04L 25/03885; H04L 25/03019
See application file for complete search history.

(56) References Cited

U.S. PATENT DOCUMENTS

| | | |
|---|---|---|
| 5,220,427 A | 6/1993 | Mikami |
| 5,267,071 A | 11/1993 | Little et al. |
| 5,347,388 A | 9/1994 | Little et al. |
| 5,384,501 A | 1/1995 | Koyama et al. |
| 5,514,950 A | 5/1996 | Sevenhans et al. |
| 5,677,646 A | 10/1997 | Entrikin |
| 6,023,196 A | 2/2000 | Ashby et al. |
| 6,369,618 B1 | 4/2002 | Bloodworth et al. |
| 6,819,166 B1 | 11/2004 | Choi et al. |
| 7,499,489 B1 | 3/2009 | Ellersick et al. |
| 7,532,070 B2 | 5/2009 | Cowley et al. |
| 7,804,356 B2 | 9/2010 | Gomez et al. |
| 8,391,349 B1 | 3/2013 | Khalili |
| 8,604,879 B2 | 12/2013 | Mourant et al. |
| 8,885,691 B1 | 11/2014 | Ren et al. |
| 9,172,566 B1 | 10/2015 | Li et al. |
| 9,281,974 B1 * | 3/2016 | Liu ..................... H03F 3/45201 |
| 9,374,217 B1 | 6/2016 | Forey et al. |
| 9,432,230 B1 | 8/2016 | Chang |
| 9,473,330 B1 | 10/2016 | Francese |
| 9,602,314 B1 * | 3/2017 | Chang ............... H04L 25/03019 |
| 9,654,310 B1 * | 5/2017 | Chang ............... H04L 25/03057 |
| 9,705,708 B1 | 7/2017 | Jin et al. |
| 9,917,607 B1 | 3/2018 | Zhang et al. |
| 9,954,503 B2 | 4/2018 | Arai |
| 10,075,141 B1 * | 9/2018 | Nagulapalli ............ H03F 3/193 |
| 10,263,815 B1 | 4/2019 | Geary et al. |

(Continued)

OTHER PUBLICATIONS

Non-Final Rejection for U.S. Appl. No. 16/876,691, 11 pgs., dated Oct. 16, 2020.

(Continued)

*Primary Examiner* — Kenneth T Lam

(57) ABSTRACT

A continuous time linear equalization (CTLE) circuit is disclosed. The CTLE circuit includes a passive CTLE circuit and an active CTLE circuit. The active CTLE circuit includes a differential transistor pair and the output of the passive CTLE is configured to drive gates or bases of the differential transistor pair.

20 Claims, 3 Drawing Sheets

(56) References Cited

U.S. PATENT DOCUMENTS

| | | | |
|---|---|---|---|
| 10,341,145 | B2 | 7/2019 | Musah et al. |
| 10,447,507 | B1* | 10/2019 | Zhang ............... H04L 25/03019 |
| 10,608,848 | B1 | 3/2020 | Azenkot |
| 10,637,695 | B1* | 4/2020 | Venkatesan ....... H04L 25/03885 |
| 10,658,016 | B1* | 5/2020 | Chang .................. G11C 7/1072 |
| 10,691,150 | B1 | 6/2020 | Delshaopour et al. |
| 10,763,865 | B1 | 9/2020 | Badizadegan |
| 10,826,502 | B1 | 11/2020 | Badizadegan |
| 10,924,307 | B1* | 2/2021 | Zhang .................... H03K 17/60 |
| 2004/0193669 | A1 | 9/2004 | Shirani |
| 2007/0013445 | A1 | 1/2007 | Fornasari et al. |
| 2007/0030092 | A1 | 2/2007 | Yeung et al. |
| 2008/0101450 | A1 | 5/2008 | Wu et al. |
| 2011/0235695 | A1 | 9/2011 | Lin |
| 2011/0317751 | A1 | 12/2011 | Roethig et al. |
| 2012/0049946 | A1 | 3/2012 | Boecker |
| 2012/0121004 | A1* | 5/2012 | Chang ....................... H03H 7/40 375/232 |
| 2012/0188014 | A1 | 7/2012 | Rane et al. |
| 2012/0299617 | A1 | 11/2012 | Zhang et al. |
| 2013/0215954 | A1 | 8/2013 | Buekema et al. |
| 2013/0322506 | A1 | 12/2013 | Zerbe et al. |
| 2014/0203839 | A1 | 7/2014 | Mandal |
| 2015/0049797 | A1 | 2/2015 | Asmanis |
| 2015/0146771 | A1* | 5/2015 | Walter ............... H04L 25/03885 375/232 |
| 2015/0180582 | A1* | 6/2015 | Zhou .................... H04B 10/564 398/182 |
| 2015/0288545 | A1 | 10/2015 | Schell et al. |
| 2015/0295736 | A1* | 10/2015 | Bulzacchelli ..... H04L 25/03057 375/233 |
| 2015/0319020 | A1 | 11/2015 | Song |
| 2016/0013955 | A1 | 1/2016 | Dong |
| 2016/0020740 | A1 | 1/2016 | Arcudia et al. |
| 2016/0065395 | A1 | 3/2016 | Song |
| 2016/0173289 | A1 | 6/2016 | Smith |
| 2016/0173299 | A1 | 6/2016 | Islam |
| 2016/0277219 | A1 | 9/2016 | Venkatram et al. |
| 2016/0352557 | A1 | 12/2016 | Liao et al. |
| 2017/0126443 | A1* | 5/2017 | Gu ........................... H03F 3/193 |
| 2018/0024175 | A1 | 1/2018 | Quan |
| 2018/0048494 | A1 | 2/2018 | Mobin et al. |
| 2018/0097139 | A1 | 4/2018 | Li et al. |
| 2018/0198647 | A1 | 7/2018 | Norimatsu |
| 2018/0234096 | A1 | 8/2018 | Li et al. |
| 2018/0288548 | A1 | 10/2018 | Quan |
| 2018/0342997 | A1 | 11/2018 | Maeda et al. |
| 2019/0253284 | A1* | 8/2019 | Jalali Far ................. H03H 7/38 |
| 2019/0305810 | A1 | 10/2019 | Pham et al. |
| 2020/0036563 | A1* | 1/2020 | Talbot ..................... H02H 9/045 |
| 2020/0153395 | A1 | 5/2020 | Geng et al. |
| 2020/0162175 | A1 | 5/2020 | Kimmit et al. |
| 2020/0313840 | A1 | 10/2020 | Den Besten |

OTHER PUBLICATIONS

Notice of Allowance for U.S. Appl. No. 16/876,691, 8 pgs. (dated Nov. 25, 2020).

Final Rejection for U.S. Appl. No. 16/876,691, 17 pgs. (dated Nov. 10, 2020).

U.S. Appl. No. 16/876,691, filed May 18, 2020, entitled: Continuous Time Linear Equalization Circuit With Programmable Gains. The Examiner is referred to the copending patent prosecution of the common Applicant (no attachment).

U.S. Appl. No. 16/876,854, filed May 18, 2020, entitled: High Bandwidth Continuous Time Linear Equalization Circuit. The Examiner is referred to the copending patent prosecution of the common Applicant (no attachment).

Non-Final Rejection for U.S. Appl. No. 16/876,854, 14 pgs. (dated Jan. 6, 2021).

Zhang, G. E. et al. "A 10 Gb/s BiCMOS Adaptive Cable Equalizer", IEEE Journal of Solid-State Circuits, vol. 40, No. 11, pp. 2132-2140 (Nov. 2005).

Lee, J. "A 20-Gb/s Adaptive Equalizer in 0.13-μm CMOS Technology" IEEE Journal of Solid-State Circuits, vol. 41, No. 9, pp. 2058-2066 (Sep. 2006).

Gondi, S. et al. "Equalization and Clock and Data Recovery Techniques for 10-Gb/s CMOS Serial-Link Receivers", IEEE Journal of Solid-State Circuits, vol. 42, No. 9, pp. 1999-2011 (Sep. 2007).

Liu, H. et al. "A 5-Gb/s Serial-Link Redriver With Adaptive Equalizer and Transmitter Swing Enhancement", IEEE Transactions on Circuits and Systems-1: Regular Papers, vol. 61, No. 4, pp. 1001-1011 (Apr. 2014).

Sahni, P. S. et al. "An Equalizer With Controllable Transfer Function for 6-Gb/s HDMI and 5.4-Gb/s DisplayPort Receivers in 28-nm UTBB-FDSOI", IEEE Transactions on Very Large Scale Integration (VLSI) Systems, vol. 24, No. 8, pp. 2803-2807 (Aug. 8, 2016).

Rahman, W. et al. "A 22.5-to-32-Gb/s 3.2pJ/b Referenceless Baud-Rate Digital CDR with DFE and CTLE in 28nm CMOS", IEEE International Solid-State Circuits Conference, pp. 120-121 (2017).

Depaoli, E. et al. "A 64 Gb/s Low-Power Transceiver for Short-Reach PAM-4 Electrical Links in 28-nm FDSOI CMOS", IEEE Journal of Solid-State Circuits, vol. 54, No. 1, pp. 6-17 (Jan. 2019).

Liu, H. et al. "An HDMI Cable Equalizer With Self-Generated Energy Ratio Adaptation Scheme", IEEE Transactions on Circuits and Systems-II: Express Briefs, vol. 56, No. 7, pp. 595-599 (Jul. 2009).

Final Rejection for U.S. Appl. No. 16/876,854, 13 pgs. (dated Apr. 14, 2021).

Notice of Allowance dated Aug. 24, 2021 in U.S. Appl. No. 16/876,854.

Balachandran, A., "0.058 nm 13Gbit/s inductorless analogue equaliser with low-frequency equalisation compensating 15 dB channel loss", Electronics Letters, IEE Stevenage GB, vol. 54, No. 2, Jan. 25, 2018.

He, J., "A 2nd Order CTLE in 130nm SiGe BiCMOS for a 50GBaud PAM4 Optical Driver", 2018 IEEE Conference on International Circuits, Technologies and Applications. May 3, 2019.

Itoh, Y., "L-Band SiGe HBT Active Differential Equalizers Providing Variable Positive or Negative Gain Slopes", 2016 21st International Conference on Microwave, Radar and Wireless Communications (MiKON), May 9, 2016.

Itoh, Y., "L-Band SiGe HBT Active Differential Equalizers with Variable Inclination and Position of the Positive or Negative Gain Slopes", Proceedings of the 46th European Microwave Conference, Oct. 4, 2016.

Parikh, S., "A 32Gb/s Wireline Receiver with a Low-Frequency Equalizer CTLE and 2-Tap DFE in 28nm CMOS", OSSCC 2013 Session 2, Ultra-High-Speed Transceivers and Equalizers 2.1, Feb. 17, 2013.

* cited by examiner

CONTINUOUS TIME LINEAR EQUALIZATION CIRCUIT

BACKGROUND

Wired communication refers to the transmission of data over a wire-based communication technology. In general, wired communications are considered to be the most stable of all types of communications services. Wide band wired data communication systems such as universal serial bus (USB), high-definition multimedia interface (HDMI), DisplayPort (DP), Peripheral Component Interconnect Express (PCIe), Thunderbolt, Converged Input Output (CIO) and any other high-speed wide band wired communication require stages of processing within their electronic circuitry. Wide band data communications system circuitry can include several stages including modules to equalize, amplify and/or re-drive signals for every data channel. Usually one stage cannot provide enough gain or equalization. In such multi-stage systems, the use of intermediate buffers between each stage may be necessary. Oftentimes, however, the buffer consumes even more power than the equalizer, amplifier and drivers, which makes a design with less buffer blocks more favorable in the system, especially for use in low voltage (i.e., ~1.8V or lower) systems. What are needed is an efficient a continuous time linear equalization circuit (CTLE).

SUMMARY

In one embodiment, a continuous time linear equalization (CTLE) circuit is disclosed. The CTLE includes an active CTLE circuit including a differential transistor pair coupled with each other via a degeneration impedance circuit of an order higher than one.

In another embodiment, a continuous time linear equalization (CTLE) circuit is disclosed. The CTLE circuit incudes a passive CTLE circuit and an active CTLE circuit. The active CTLE circuit includes a differential transistor pair. The output of the passive CTLE is configured to drive the gates/bases of the differential transistor pair.

In some examples, the active CTLE circuit includes a degeneration impedance circuit. The degeneration impedance circuit is a second order degeneration impedance circuit including a capacitor, a resistor and an inductor coupled in a series and a resistor coupled in parallel with the series.

In some other embodiments, the degeneration impedance circuit is a third order degeneration impedance circuit including a capacitor, a resistor and an inductor coupled in a series and a resistor coupled in parallel with the series. A capacitor and a resistor is coupled to the inductor in parallel.

In one example, the passive CTLE circuit includes a first order impedance circuit or a second order impedance circuit. Third or higher impedance circuits may also be used in some embodiments. The first order impedance circuit includes a capacitor coupled to a first resistor in parallel and to an output through a second resistor. The second order impedance circuit includes a first capacitor coupled to a first resistor in parallel and to an output through a second resistor and to ground through an inductor and a second capacitor.

In some embodiments, The CTLE circuit may include a gain stage to compensate for a DC loss caused by the passive CTLE circuit. The passive CTLE is configured to add poles and zeros to AC response of the CTLE circuit.

In some embodiments, the active CTLE includes a degeneration impedance circuit having a resistive component and the active CTLE circuit is configured to adjust a DC gain by adjusting the resistive component.

In another embodiment, a CTLE circuit is disclosed. The CTLE circuit includes a passive CTLE circuit including a second order impedance circuit and an active CTLE circuit including a differential transistor pair. The output of the passive CTLE is configured to drive the gates/bases of the differential transistor pair. The active CTLE circuit includes a higher order degeneration impedance circuit coupled between sources/emitters of the differential transistor pair. The CTLE circuit further includes a DC gain stage coupled with the active CTLE circuit to compensate for a DC loss due to the passive CTLE circuit. In some examples, the higher order degeneration impedance circuit includes a capacitor, a resistor and an inductor coupled in a series and a resistor coupled in parallel with the series. In another example, the higher order degeneration impedance circuit includes a capacitor, a resistor and an inductor coupled in a series and a resistor coupled in parallel with the series, wherein a capacitor and a resistor is coupled to the inductor in parallel.

BRIEF DESCRIPTION OF THE DRAWINGS

Throughout the description, similar reference numbers may be used to identify similar elements.

DETAILED DESCRIPTION

Figure 1:
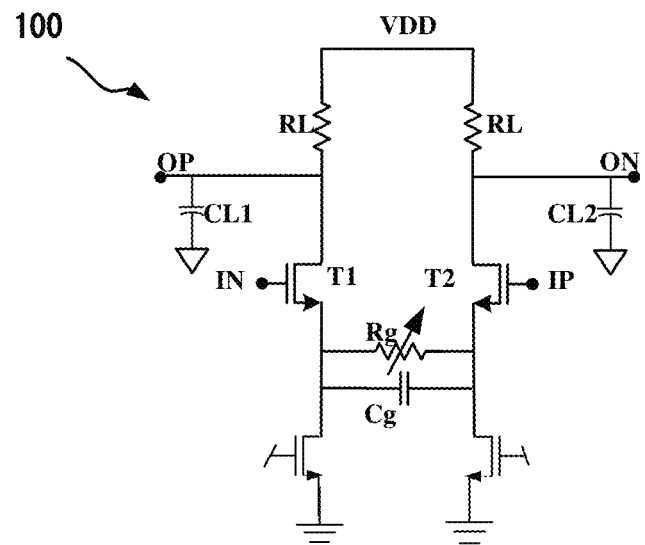
FIG. 1 shows a conventional continuous time linear equalization (CTLE) circuit.

It will be readily understood that the components of the embodiments as generally described herein and illustrated in the appended FIGS. could be arranged and designed in a wide variety of different configurations. Thus, the following more detailed description of various embodiments, as represented in the FIGS., is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

The embodiments described herein use "one" stage CTLE to provide higher channel loss compensation. More stages for CTLE causes more power consumption. Therefore, it is advantageous to provide higher channel loss compensation in one stage.

One or more embodiments described herein use a higher order degeneration impedance to provide well controlled higher channel loss compensation. Further, a higher order degeneration raises and roll off of CTLE frequency response (i.e., equally faster out of band attenuation, which suppresses more out of band noises and sharper in band increase).

Degeneration impedance can be 2nd, 3rd, 4th or any custom order/shape to achieve the required channel loss compensation. The use of higher order degeneration impedance does not impact the maximum AC gain of CTLE, but adding more low frequency loss will increase the peaking gain by definition (difference between DC gain and AC gain at Nyquist frequency). At Gb/s data rates, the skin effect and dielectric loss of the transmission channel cause frequency-dependent loss, thus resulting in inter-symbol interference (ISI). As computing systems become faster than ever, signal integrity has also become a critical issue for designers due to the rapidly deteriorated inter-symbol interference (ISI) in slower transmission media and systems. Transmission of off-chip data at high frequencies results ISI due to the bandwidth limitation of the channel used. It results in a significant attenuation at high frequencies, hence degrades the performance and increases bit error rate (BER). To overcome these limitations, equalizers are used in high speed serial links. U.S. Pat. No. 10,447,507 by Xu Zhang et al entitled "LOW SUPPLY LINEAR EQUALIZER WITH PROGRAMMABLE PEAKING GAIN", which is incorporated herein by reference, describes a linear equalizer. US Pat. Pub. US20080101450A1 by Wu entitled "SECOND ORDER CONTINUOUS TIME LINEAR EQUALIZER", which is incorporated herein by reference, describes various examples of a CTLE.

A CTLE is employed at the receiver (RX) front end to compensate the channel loss and provide an equalized low-jitter output data. Further, the linear equalizer ensures the precursor as well as postcursor equalization as against the nonlinear equalizing techniques like the decision-feedback equalization (DFE), which realizes only postcursor equalization. Longer cable or connecting paths on a printed circuit board (PCB) means more insertion loss at certain frequencies. The primary function of a CTLE circuit is compensation of the loss. A CTLE will compensate the loss and provides a fairly flat gain in the frequency bandwidth of interest.

FIG. 1 shows a conventional CTLE circuit 100. The conventional CTLE circuit 100 includes input ports IN, IP and output ports OP, ON. The output port OP is coupled to a capacitor CL1 that is coupled to ground. Similarly, the output port ON is coupled to a capacitor CL2 that is coupled to ground. The input port IN is coupled with the gate of a transistor T1 and the input port IP is coupled with the gate of a transistor T2. A terminal of the transistor T1 and the transistor T2 are coupled together via a variable resistor Rg and a capacitor Cg. The resistor Rg and the capacitor Cg are coupled with each other in parallel.

An equalizer realizes a transfer function which can be tuned such that it is inverse of the channel transfer function. If properly tuned, the equalizer improves the receiver performance parameters, such as BER and jitter tolerance. A conventional capacitive source-degenerated first-order CTLE, as shown in FIG. 1, with one zero and two poles, provides limited capability to control the shape of CTLE transfer function. Poles and Zeros of a transfer function are the frequencies for which the value of the denominator and numerator of transfer function becomes zero respectively. The values of the poles and the zeros of a system determine whether the system is stable, and how well the system performs. In a conventional CTLE, the DC gain, transfer function and maximum (peak) gain can be defined as:

$$Adc = 2R_L/(Rg + 2/g_m) \quad (1)$$

$$H(s) \approx Adc(1 + s\, RgCg)/((1 + s\, RgCg/(1 + g_m Rg/2)(1 + s\, RLCL)) \quad (2)$$

$$Apk = g_m * R_L \quad (3)$$

where $g_m$ is the transconductance of differential pair transistors T1, T2. Equation 1 shows that Rg adjustment will change DC gain and zero location. However, It is difficult to get high peaking gain and equal gain steps from this conventional CTLE circuit without adding multiple stages of the convention CTLE in series. However, adding multiple stages may consume more power and take more space on a device and generate more noise.

Figure 3:
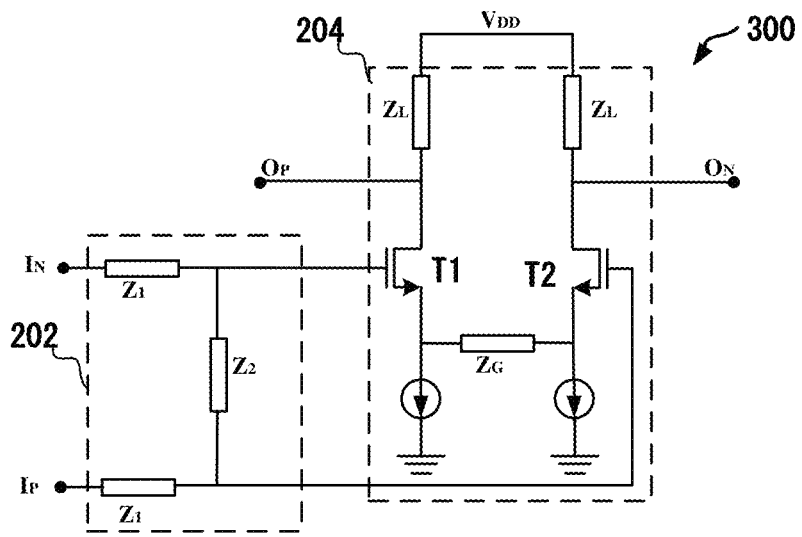
FIG. 3 depicts a CTLE circuit in accordance with one or more embodiments.

Although a CMOS based circuit is shown in FIG. 3, the circuit of FIG. 3 may also be implemented using a BJT based circuit. For the conventional CTLE circuit 100, the tuning can be done by changing different source degeneration resistor for CMOS circuit or emitter degeneration resistor for BJT circuit. The DC attenuation will be changed while the peak gain is fixed (Peak gain=$g_m * R_L$). In addition, when the degeneration resistor is changed, the peaking frequency changes because the zero created by degeneration RC pair ($\omega_{zero} = 1/Rg\, Cg$) while the capacitor is fixed. To keep the peak frequency fixed, Rg and Cg are tuned/adjusted to get different peaking gain and maintain the same peaking frequency. For high speed applications, the tuning method of the conventional CTLE circuit 100 can cause problems. Due to parasitic components of the circuit, using discrete tuning steps, means there should be different resistor and capacitor settings for each step.

Active components of the conventional CTLE 100 introduce parasitic resistance and capacitance. These parasitic resistance and capacitance cannot be well controlled and will cause unexpected peaking at low frequency or reduce the expected tuning range because the parasitic resistor and capacitor need to be calculated into the total amount of capacitance and resistance that may cause reduction in the tuning range. If using varactors as the tuning capacitor, it will introduce less parasitic to circuit. However, the tuning may not predictable because the exact value of the varactor is unknown. Varactor is non-linear. It can degrade the overall linearity of the CTLE.

Figure 2:
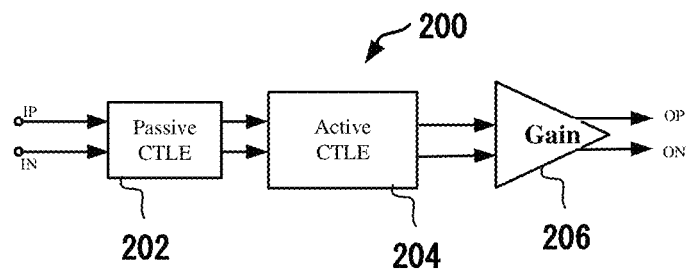
FIG. 2 shows a block diagram of a CTLE circuit in accordance with one or more embodiments.

FIG. 2 shows a CTLE 200 that is a combination of a passive CTLE 202 and an active CTLE 204. A gain stage 206 may be added at the output stage of the active CTLE 204. Adding a passive CTLE 202 to an active CTLE 204 may cause low frequency loss but will also provide extra poles and zeros to AC response of the CTLE 200 that provides extra AC loss compensation. The gain stage 206 compensate for the DC loss. In some embodiments, if the DC loss is within tolerable limits, the gain stage 206 may be omitted.

FIG. 3 shows a CTLE circuit 300 that includes a passive CTLE 202 including Z1 and Z2 coupled to the input ports $I_N$, $I_P$, and an active CTLE 204 including a differential transistor pair T1, T2. The active CTLE also includes impedances $Z_G$ and $Z_L$. The active CTLE includes output ports $O_P$, $O_N$. Supply $V_{DD}$ is coupled to impedances $Z_L$. $Z_L$ may be a pure resistive impedance or may also be a higher order impedance including an inductor. The output of the passive CTLE drives the gates of the transistors T1, T2.

Peak gain of the CTLE 300, as defined by Equation 3 does not change by $Z_G$ impedance and DC gain as defined by Equation 4 does not change with the AC components of the impedance $Z_G$.

$$H(s) \sim g_m Z_L / (1 + g_m^* Z_G) \quad (4)$$

Increasing the resistive part of the degeneration impedance $Z_G$ will reduce the DC gain but will increase the peaking gain. Pole(s) and zero(s) can be adjusted in a way that a higher bandwidth is achievable. A known ratio between high frequency and low frequency spectrum of the input signal in a desired bandwidth may be achieved by adjusting the values of impedance components of the CTLE 300. Making $Z_G$ a "higher order" impedance increases positive and negative slope of CTLE curve (equally higher channel loss compensation and more out of band suppression). The higher order impedance can be implemented by adding an inductor to $Z_G$.

Figure 4A:
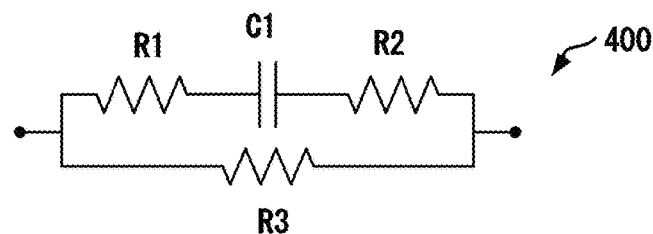
FIGS. 4A-4C show embodiments of degeneration impedance circuits for the CTLE circuit of FIG. 3 in accordance with one or more embodiments.
Figure 4B:
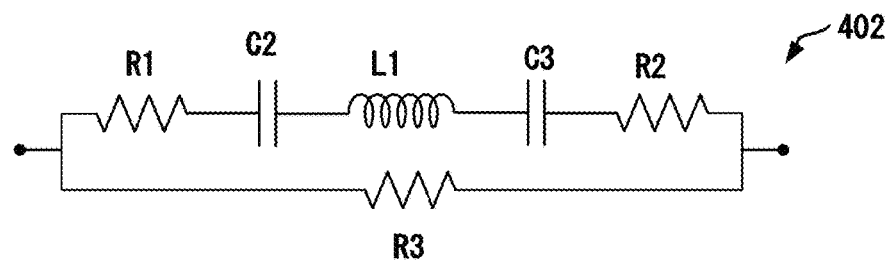
Figure 4C:
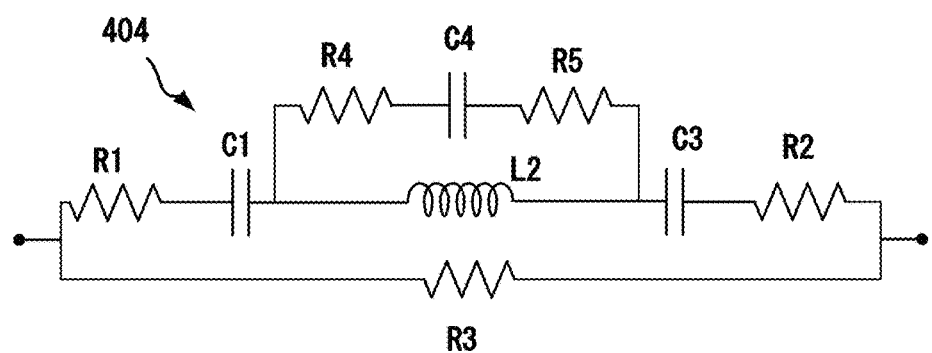

FIGS. 4A, 4B, 4C shows realistic implementations of $Z_G$ in various embodiments. FIG. 4A shows a first order impedance implementation 400 of $Z_G$. Accordingly, $Z_G$ 400 includes a resistor R1 coupled to a capacitor C1 in series and the capacitor C1 coupled with a resistor R2 in series. The series including R1, C1 an R2 is coupled to a resistor R3 in parallel. FIG. 4B provides a second order impedance implementation 402 of $Z_G$ in which the capacitor C1 is replaced by a series of a capacitor C2, an inductor L1 and a capacitor C3. FIG. 4C shows a third order impedance implementation 404 of $Z_G$. In the third order impedance implementation 404, the inductor L1 (in FIG. 4B) is replaced by a series of a resistor R4, a capacitor C4 and a resistor R5 coupled to an inductor L2 in parallel. All impedances have been shown in symmetric form to comply with the fully differential form of CTLE 300.

Generally, the gain of the CTLE circuit 300 may be defined as follows:

Gain=$g_m^* Z_L/(1+g_m Z_G)$, where $Z_G$=Z(s) defines the degeneration impedance order. If Z(s)=R, the order=0. If Z(s)=R∥sC or R+sC, the order=1. If Z(s)=R+sL+1/sC=(sRC+s^2LC+1)/sC, the order=2. In general, $Z(s)=k(1+a \cdot s + b \cdot s^2 + c \cdot s^3 + \ldots)$ defines the order of impedance.

The passive CTLE 202 practically performs as a passive filter with a desired AC response. The transfer function of the passive CTLE may be represented as:

$$\text{OUT/IN} = Z_2/(Z_1 + Z_2) \quad (5)$$

Figure 4D:
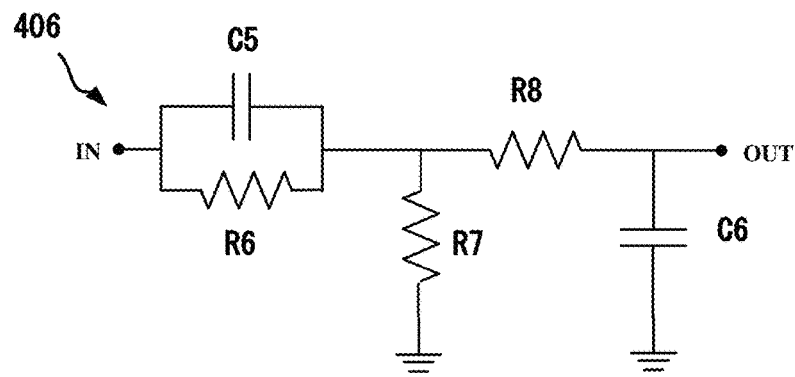
FIGS. 4D-4E show embodiments of passive CTLE circuits for the CTLE circuit of FIG. 3 in accordance with one or more embodiments.

FIG. 4D shows a single ended form of passive CTLE circuit 406 in one embodiment. Accordingly, the passive CTLE circuit 406 includes a capacitor C5 coupled with a resister R6 in parallel and one terminal of the capacitor C5 coupled with the input port. The capacitor C5 is coupled with a resistor R7 and the resistor R7 is also coupled with ground. The resistor R7 is coupled with a resistor R8 and the resistor R8 is coupled with a capacitor C6. The capacitor C6 is coupled with ground on one end and to the output port on the other end.

Figure 4E:
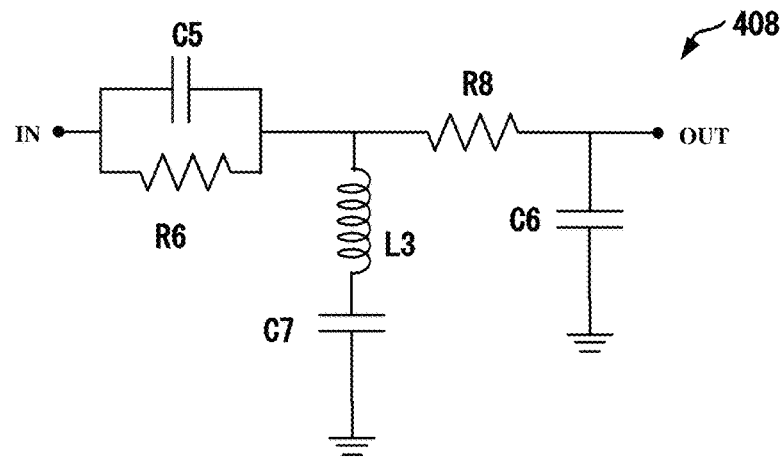

FIG. 4E shows the passive CTLE circuit 408 which provide a higher order impedance than the passive CTLE circuit 406. In the passive CTLE circuit 408, the resistor R7 is replaced by a capacitor C7 coupled with an inductor L3 in series. In some other embodiments, a resistor may also be added to the combination of the capacitor C7 and the inductor L3.

The impedances shown in FIGS. 4A-4E shows one of many possible circuit arrangements. Even though the impedance up to $3^{rd}$ order is shown, the embodiments described herein will work with impedances of higher order than $3^{rd}$ order.

Figure 5:
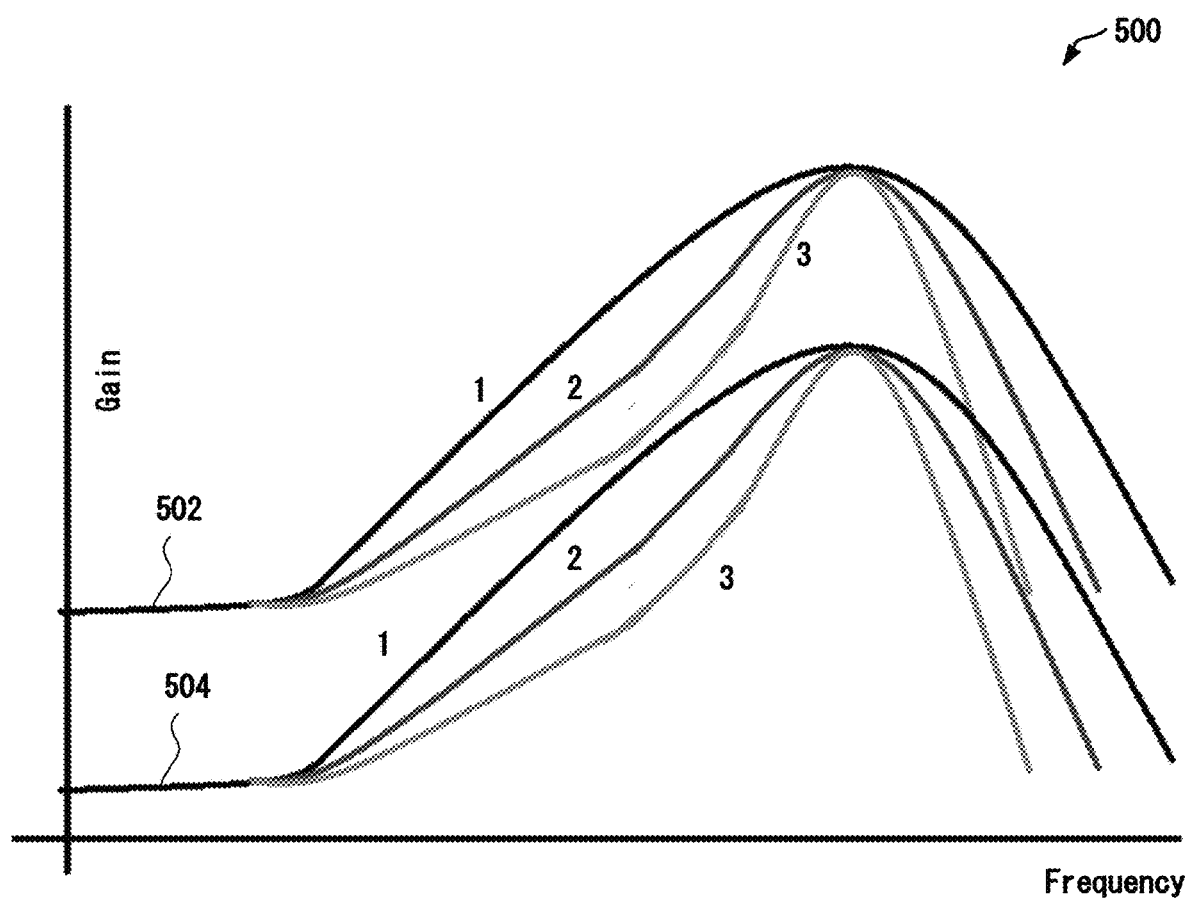
FIG. 5 shows gain curves of the CTLE circuit of FIG. 3 in accordance with one or more embodiments.

FIG. 5 shows a gain to frequency diagram 500. The diagram 500 includes two curves 502, 504. The curve 502 is a response of the CTLE 200 with the optional gain stage 206 and the curve 504 shows a response of the CTLE 200 without the gain stage 206. The curve 502 and the curve 504 show similar responses except the curve 502 shows enhanced DC level. The curve 502 includes sub-curves 1, 2, 3 that represent the order of $Z_G$ (e.g., 1=first order, 2=second order and 3=third order implementation). As shown, the sub-curve 3 of the curve 502 shows a sharper rise in the gain with the frequency compared to lower order impedance implementations.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A continuous time linear equalization (CTLE) circuit, comprising a passive CTLE and an active CTLE circuit including a differential transistor pair coupled with each other via a degeneration impedance circuit of an order equal to or higher than two, wherein an output of the passive CTLE is configured to drive gates or bases of the differential transistor pair, wherein the degeneration impedance circuit includes a resistive component, and wherein the active CTLE circuit is configured to adjust a DC gain by adjusting the resistive component.

2. The CTLE circuit of claim 1, wherein the degeneration impedance circuit is a second order degeneration impedance circuit including a capacitor, a resistor and an inductor coupled in a series and a resistor coupled in parallel with the series.

3. The CTLE circuit of claim 1, wherein the degeneration impedance circuit is a third order degeneration impedance circuit including a capacitor, a resistor and an inductor coupled in a series and a resistor coupled in parallel with the series, wherein a capacitor and a resistor is coupled to the inductor in parallel.

4. A continuous time linear equalization (CTLE) circuit, comprising:
   a passive CTLE circuit; and
   an active CTLE circuit including a differential transistor pair, wherein an output of the passive CTLE is configured to drive gates or bases of the differential transistor pair; and
   wherein the passive CTLE circuit includes a second order impedance circuit.

5. The CTLE circuit of claim 4, wherein the active CTLE circuit includes a degeneration impedance circuit.

6. The CTLE circuit of claim 5, wherein the degeneration impedance circuit is a second order degeneration impedance circuit including a capacitor, a resistor and an inductor coupled in a series and a resistor coupled in parallel with the series.

7. The CTLE circuit of claim 5, wherein the degeneration impedance circuit is a third order degeneration impedance circuit including a capacitor, a resistor and an inductor coupled in a series and a resistor coupled in parallel with the series, wherein a capacitor and a resistor is coupled to the inductor in parallel.

8. The CTLE circuit of claim 5, wherein the active CTLE includes a degeneration impedance circuit having a resistive component, wherein the active CTLE circuit is configured to adjust a DC gain by adjusting the resistive component.

9. The CTLE circuit of claim 4, wherein the passive CTLE circuit includes a first order impedance circuit.

10. The CTLE circuit of claim 9, wherein the first order impedance circuit includes a capacitor coupled to a first resistor in parallel and to an output through a second resistor.

11. The CTLE circuit of claim 4, wherein the second order impedance circuit includes a first capacitor coupled to a first resistor in parallel and to an output through a second resistor and to ground through an inductor and a second capacitor.

12. The CTLE circuit of claim 4, further including a gain stage to compensate for a DC loss.

13. The CTLE circuit of claim 4, wherein the passive CTLE is configured to add poles and zeros to an AC response of the CTLE circuit, which increases the peaking gain of the CTLE.

14. A continuous time linear equalization (CTLE) circuit, comprising:
   a passive CTLE circuit including a second order impedance circuit; and
   an active CTLE circuit including a differential transistor pair, wherein an output of the passive CTLE is configured to drive gates or bases of the differential transistor pair, wherein the active CTLE circuit includes a second or higher order degeneration impedance circuit coupled between sources or emitters of the differential transistor pair; and
   a DC gain stage coupled with the active CTLE circuit to compensate for a DC loss due to the passive CTLE circuit.

15. The CTLE circuit of claim 14, wherein the higher order degeneration impedance circuit includes a capacitor, a resistor and an inductor coupled in a series and a resistor coupled in parallel with the series.

16. The CTLE circuit of claim 14, wherein the higher order degeneration impedance circuit includes a capacitor, a resistor and an inductor coupled in a series and a resistor coupled in parallel with the series, wherein a capacitor and a resistor is coupled to the inductor in parallel.

17. A continuous time linear equalization (CTLE) circuit, comprising a passive CTLE and an active CTLE circuit including a differential transistor pair coupled with each other via a degeneration impedance circuit of an order equal to or higher than two, wherein an output of the passive CTLE is configured to drive gates or bases of the differential transistor pair, wherein the degeneration impedance circuit is a second order degeneration impedance circuit including a capacitor, a resistor and an inductor coupled in a series and a resistor coupled in parallel with the series.

18. A continuous time linear equalization (CTLE) circuit, comprising a passive CTLE and an active CTLE circuit including a differential transistor pair coupled with each other via a degeneration impedance circuit of an order equal to or higher than two, wherein an output of the passive CTLE is configured to drive gates or bases of the differential transistor pair, wherein the degeneration impedance circuit is a third order degeneration impedance circuit including a capacitor, a resistor and an inductor coupled in a series and a resistor coupled in parallel with the series, wherein a capacitor and a resistor is coupled to the inductor in parallel.

19. A continuous time linear equalization (CTLE) circuit, comprising:
   a passive CTLE circuit including a first order impedance circuit;
   a gain stage to compensate for a DC loss; and
   an active CTLE circuit including a differential transistor pair, wherein an output of the passive CTLE is configured to drive gates or bases of the differential transistor pair.

20. A continuous time linear equalization (CTLE) circuit, comprising:
   a passive CTLE circuit including a first order impedance circuit, wherein the passive CTLE is configured to add poles and zeros to an AC response of the passive CTLE circuit which increases the peaking gain of the CTLE; and an active CTLE circuit including a differential transistor pair, wherein an output of the passive CTLE is configured to drive gates or bases of the differential transistor pair.

* * * * *